(12) United States Patent
Illegems

(10) Patent No.: US 7,952,402 B2
(45) Date of Patent: May 31, 2011

(54) POWER-UP CONTROL FOR VERY LOW-POWER SYSTEMS

(75) Inventor: Paul F. Illegems, Tucson, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 8 days.

(21) Appl. No.: 12/367,242

(22) Filed: Feb. 6, 2009

(65) Prior Publication Data
US 2010/0201410 A1    Aug. 12, 2010

(51) Int. Cl.
H03L 7/00    (2006.01)
(52) U.S. Cl. .......................................... 327/143; 327/142
(58) Field of Classification Search ............ 327/142, 327/143
See application file for complete search history.

(56) References Cited

U.S. PATENT DOCUMENTS

| | | | |
|---|---|---|---|
| 5,744,990 A * | 4/1998 | Burstein et al. | 327/143 |
| 6,259,285 B1 * | 7/2001 | Woods | 327/143 |
| 6,515,524 B1 | 2/2003 | Sterrantino et al. | |
| 6,587,356 B2 | 7/2003 | Zhu et al. | |
| 6,735,142 B1 | 5/2004 | Oh | |
| 6,822,646 B2 * | 11/2004 | Kang | 345/212 |
| 6,831,481 B1 | 12/2004 | Nguyen et al. | |
| 6,861,739 B1 * | 3/2005 | Bhavnagarwala et al. | 257/691 |
| 6,980,047 B1 | 12/2005 | Kuo | |
| 7,015,732 B1 * | 3/2006 | Holloway et al. | 327/143 |
| 7,564,278 B2 | 7/2009 | Chen | |
| 7,567,098 B2 * | 7/2009 | Frew et al. | 327/143 |
| 7,570,091 B2 | 8/2009 | Sugio | |
| 7,602,225 B2 | 10/2009 | Seo et al. | |
| 7,639,052 B2 | 12/2009 | Xiao et al. | |
| 7,667,489 B1 | 2/2010 | Vasudevan | |
| 2003/0020525 A1 * | 1/2003 | Shigemasa et al. | 327/143 |
| 2008/0122499 A1 * | 5/2008 | Frew et al. | 327/143 |
| 2008/0246509 A1 * | 10/2008 | Xiao et al. | 326/39 |
| 2009/0268493 A1 | 10/2009 | Wu | |
| 2010/0156477 A1 | 6/2010 | Chellappa | |

OTHER PUBLICATIONS

Robert A. Pease; "Band Gap References"; IEEE Proceedings of the 1990 Bipolar Circuits and Technology Meeting, Sep. 17-18, 1990 in Minneapolis, Minnesota; 11 pages. Retrieved from Internet: <http://www.national.com/rap/Application/0,1570,24,00.html>.

* cited by examiner

*Primary Examiner* — Lincoln Donovan
*Assistant Examiner* — Adam D Houston
(74) *Attorney, Agent, or Firm* — Meyertons Hood Kivlin Kowert & Goetzel, P.C.; Jeffrey C. Hood

(57) ABSTRACT

A power-on-reset (POR) circuit may comprise a first circuit powered by a first supply voltage and configured to generate a second supply voltage based on the first supply voltage, the second supply voltage having a nominal value lower than a nominal value of the first supply voltage. The POR circuit may also include a second circuit powered by the second supply voltage and configured to generate a POR signal. The second circuit may be configured to assert the POR signal when the second supply voltage reaches a value that is sufficiently high for the second circuit to become operational, keep the POR signal asserted until the first supply voltage reaches a second value that is higher than the nominal value of the second supply voltage by a specified difference voltage value, and deassert the POR signal once the first supply voltage reaches the second value.

46 Claims, 5 Drawing Sheets

US 7,952,402 B2

POWER-UP CONTROL FOR VERY LOW-POWER SYSTEMS

BACKGROUND OF THE INVENTION

1. Field of the Invention

This invention relates generally to the field of semiconductor circuit design, and more particularly to the design of improved power-up control in low-power systems.

2. Description of the Related Art

A POR (power-on-reset) signal is typically required by digital circuits such as memory elements, flip-flops, microcontrollers and central processing units to set an initial state immediately after powering on the circuit. For example, when powered on, most of the programmed or programmable type logic circuits, in particular microprocessors, must be set in a zero state or RESET state in order to insure that no undetermined logic states are present in any portion of the circuit. This signal has been traditionally generated externally, typically using an external RC circuit or simply a switch, the latter having to be manually operated in most cases.

More recently, integrated POR circuits have been incorporated into system on a chip (SOCs) circuits and/or more extensive controller chips and integrated circuits. Some integrated POR circuits typically deliver a RESET signal when the supply voltage rises and reaches a first switching threshold voltage, and release the RESET signal upon the supply voltage reaching a second switching threshold voltage. One problem of integrating a POR circuit operated according to this technique is with the rate of the rise of the power supply, which is generally quite slow. As a result, the RC time constant needs to be very large for successful generation of a POR signal. Realization of such high time constants on chip may take up too much space to be practical, although the same time constant may be easily realized in an external circuit.

Accurate reset generators typically require a bandgap voltage reference. A bandgap voltage reference is a voltage reference widely used in integrated circuits, and has been a preferred method of generating a stable low-voltage (~1.25 V) reference in many low-voltage analog circuits. Bandgap circuits have also been used in digital integrated circuits (ICs) to provide a local bias that is not adversely affected by ambient noises or transients. Typically, a bandgap circuit relies on two sets of transistors running at different emitter current densities, one set of transistors having approximately ten times the emitter current density of the other set of transistors, resulting in an approximately 60 mV voltage difference between the base-emitter voltages ($V_{be}$) of the two sets of transistors. This voltage difference is typically amplified by a factor of about 10 and added to a $V_{be}$ voltage.

FIGS. 1a and 1b provide examples of prior art circuits used in powering up a system. In FIG. 1a, a Main Logic Block is powered by a supply voltage (Vdd) generated by a Voltage Regulator, which is powered by an external voltage HV. The Voltage Regulator is configured to operate with a bandgap reference voltage $V_{BG}$, which is generated by a Bandgap reference circuit powered by HV, and brought to its proper operating level by a Bandgap start-up circuit, which is also powered by HV. A separate POR circuit, which may be powered by HV or Vdd, is used to provide the required POR signal to the Main Logic Block. In FIG. 1b, the separate POR circuit is replaced by a Reset Generator configured to operate with $V_{BG}$. The Reset Generator then provides the necessary reset signal to the Main Logic Block. In both cases a main system memory is also coupled to the Main Logic Block.

As seen in FIGS. 1a and 1b, the Bandgap Reference circuit may require a Bandgap start-up circuit to bring it to the proper operating point. Once the Bandgap Reference circuit has reached the desired operating point, the Bandgap start-up circuit will typically continue to draw a certain amount of current as long as the power remains turned on. Thus, a typical start-up circuit will always continuously consume some current, adding to undesired quiescent currents in the system. In addition, a typical Reset Generator will not operate accurately if the reference voltage ($V_{BG}$) it uses has not reached its final level, which may happen if the supply voltage (Vdd) reaches the desired operating level very slowly. In some cases, the Main Logic Block (or circuit) may be kept in the reset state with a simple POR circuit operated without the use of a bandgap reference (FIG. 1a), which may result in the POR circuit tripping at an unpredictable voltage. Although this voltage level may be sufficient for the Main Logic Block circuits to operate, it may be too low to read an on-chip memory (such as the Memory in FIGS. 1a and 1b). A POR circuit on the external power supply side may also effectively perform the task, but it may not be accurate enough.

Many other problems and disadvantages of the prior art will become apparent to one skilled in the art after comparing such prior art with the present invention as described herein.

SUMMARY OF THE INVENTION

In one set of embodiments, a power-on-reset (POR) signal generation circuit may be configured to control the start-up of a bandgap reference and the generation of a POR signal in a system with a high, wide-ranging first supply voltage external to the system, and a lower second supply voltage (Vdd) generated from the first supply voltage and the bandgap reference, and regulated inside the system. The POR circuit may operate to keep the POR signal active until Vdd has reached its final level, and may be configured to exhibit the same behavior and go through the proper reset cycle if necessary every time power is turned on or off. The POR circuit may further be configured to consume only minimal sub-µA quiescent supply current, with a modest amount of current used during the power-up phase. The bandgap reference may accurately control the level of Vdd, even when the external power supply HV has large variations. The POR signal may be used to reset any selected main logic block within the system.

The start-up of the bandgap reference may be controlled and the main logic block may be held in the reset state until the internal supply voltage reaches its nominal (actual final) level. This may guarantee a proper reset of the main logic and a re-start of the bandgap reference, should the power drop below operational level then rise up to operational levels once again. Following power-up, when the main logic block is no longer in reset and is running, the circuits associated with powering up may be turned off, thereby saving supply current.

Various embodiments of the POR circuit may be configured to detect a voltage difference between input voltage and output voltage of the regulator responsible for generating the second supply voltage. Various embodiments of the POR circuit may be configured with latches that may be used to control the states of a bandgap start-up circuit used for controlling start-up of the bandgap reference. The latches may also be used to control a detector configured to generate a control signal indicative that the second supply voltage has reached a stable, operational level (in other words, it has reached its nominal value). Various embodiments of the POR circuit may be configured to turn off certain circuits when the supply power (second supply voltage) is valid, and turn them back on when the power drops below a certain level.

In one set of embodiments, a POR signal may be generated to reset a system, or to reset select portions of the system. An internal supply voltage may be generated based on an external supply voltage, the internal supply voltage having a nominal value lower than a nominal value of the external supply voltage. The POR signal may be asserted in response to the internal supply voltage reaching a value that is sufficiently high for devices powered by the internal supply voltage to become operational, and the POR signal may be kept asserted until the external supply voltage reaches a value that is higher than the nominal value of the internal supply voltage by a specified difference voltage value. The POR signal may be deasserted in response to the external supply voltage reaching the value that is higher than the nominal value of the internal supply voltage by the specified difference voltage value.

Other aspects of the present invention will become apparent with reference to the drawings and detailed description of the drawings that follow.

BRIEF DESCRIPTION OF THE DRAWINGS

The foregoing, as well as other objects, features, and advantages of this invention may be more completely understood by reference to the following detailed description when read together with the accompanying drawings in which.

Figure 1A:
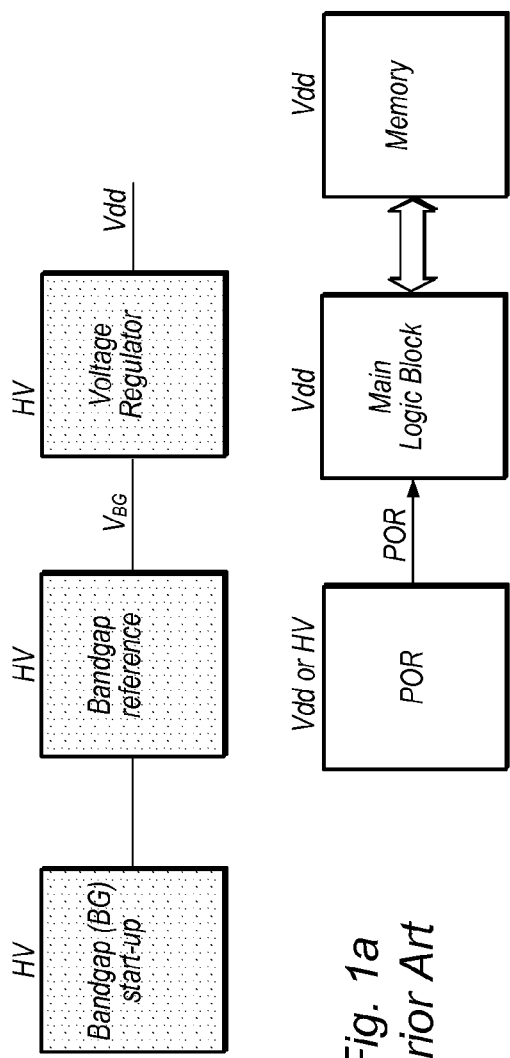
FIGS. 1a and 1b show examples of prior art circuits used in powering up a system.
Figure 1B:
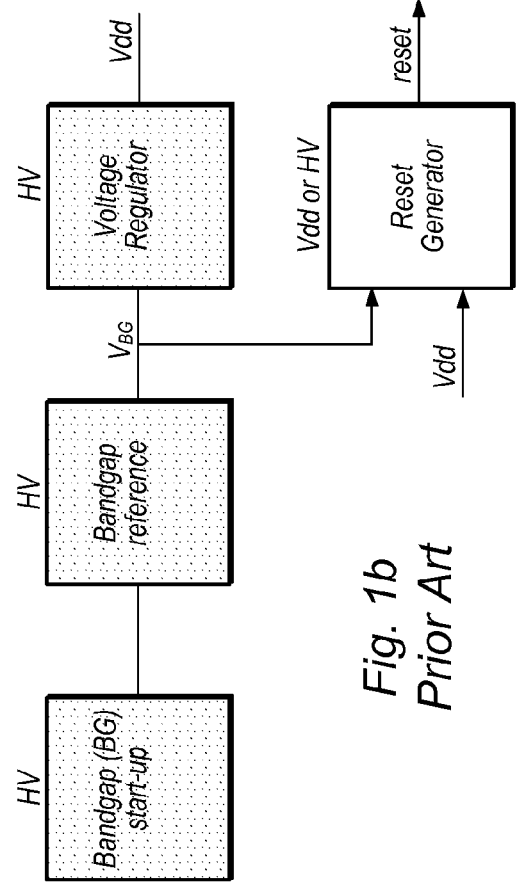

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

As used herein, the term "nominal value" is used to denote an expected, stable value. For example, the nominal value of a first supply voltage is used to denote the final, stable value reached by the first supply voltage. While the term "nominal" typically refers to a specified theoretical value from which an actual value may deviate ever so slightly, in order to simplify references to certain voltage values detailed herein, "nominal value" is used to refer to the final, expected stable value reached by a supply voltage. For example, as used herein, when a supply voltage has a nominal value of 1.9V, it means that the supply voltage is configured to settle and reside at a value of 1.9V. Of course, the actual value of the supply voltage may deviate ever so slightly from this value, and such deviations are meant to be accounted for when using the term "nominal value". In other words, when a first supply voltage is said to have a value that is higher by a specific difference voltage than the nominal value of the second supply voltage, the specific difference voltage denotes a difference from the actual, stable value of the second supply voltage.

Figure 2:
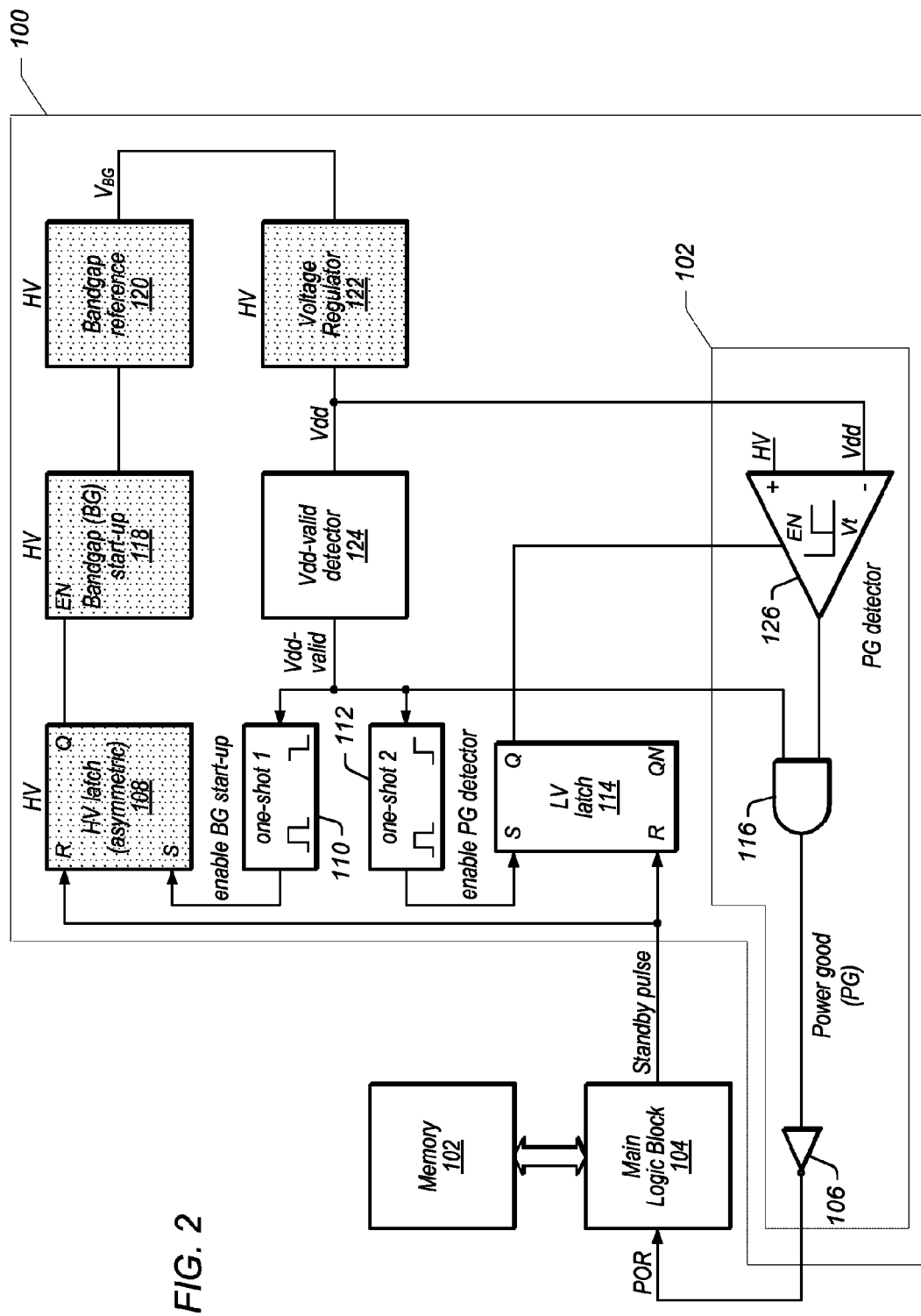
FIG. 2 is a block diagram of one embodiment of a power-on-reset (POR) circuit, according to principles of the present invention.

FIG. 2 is a logic diagram of one embodiment of a power-on-reset (POR) circuit 100. In the embodiment shown in FIG. 2, HV represents a primary supply voltage that may be generated and/or provided by an external power supply to supply power to HV latch 108, Bandgap (BG) startup circuit 118, BG reference circuit 120, and voltage regulator 122. In one set of embodiments, a first circuit, which is voltage regulator 122 in FIG. 2, may be configured to generate the desired power supply voltage Vdd for a main circuit, integrated circuit and/or chip. Thus, Vdd is a derived supply voltage from primary supply voltage HV. In some embodiments, voltage regulator 122 may be configured on-chip to provide the supply voltage Vdd for powering various components configured on the chip (integrated circuit (IC) and/or system-on-chip (SOC)). HV latch 108 may be configured to assert its output Q (as the default) upon power-up. Thus, in POR circuit 100, at the initial power-up of the external power supply (which may be configured to provide a "high voltage" HV that may be higher than the desired on-chip supply voltage Vdd), HV latch 108 may assert its Q output (in preferred embodiments this means a high value for the Q output of HV latch 108), and bandgap start-up circuit 118 may be enabled. This in turn may enable bandgap reference voltage $V_{BG}$, and assert a $V_{BG}$ voltage at its output. As mentioned above, voltage regulator 122 may be configured to provide a Vdd output as the main internal supply voltage of the chip. Vdd may be proportional to $V_{BG}$, and may track the external (high) supply voltage HV until Vdd has reached its final level as dictated by $V_{BG}$.

Figure 3:
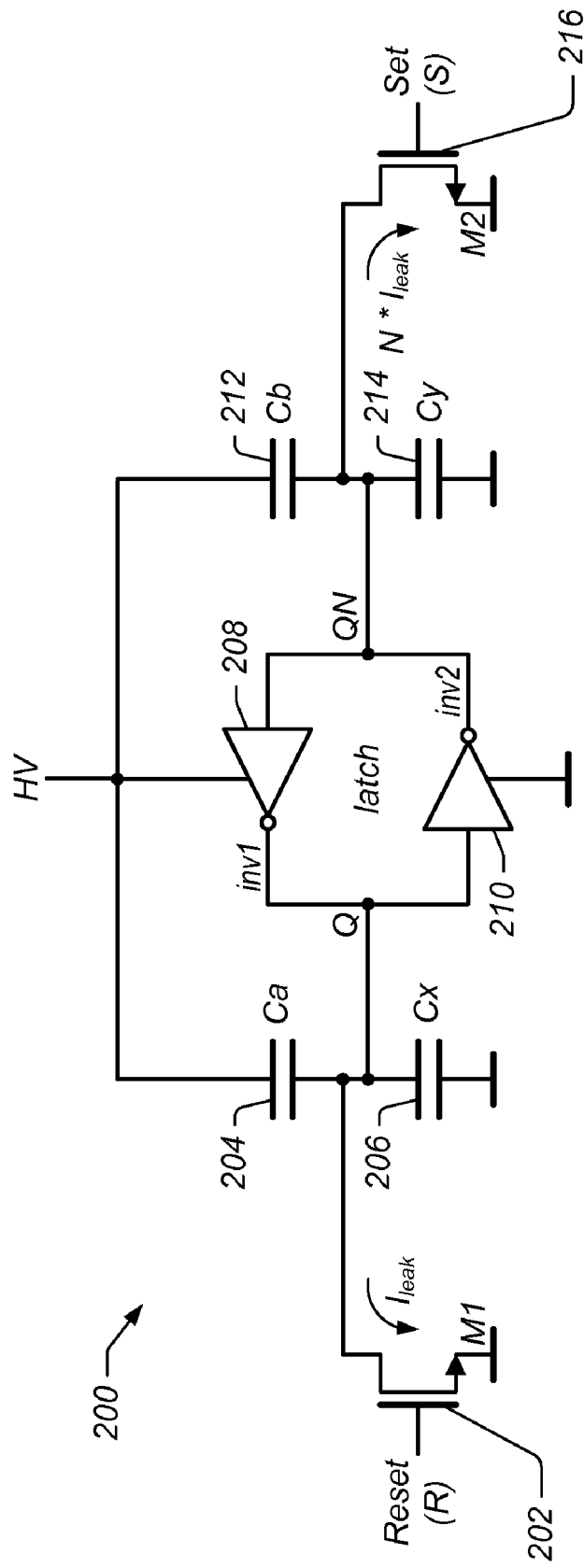
FIG. 3 is a circuit diagram of one embodiment of the HV latch from FIG. 2, according to principles of the present invention.

In one set of embodiments, HV latch 108 may be designed to always come up in the same state, which may be accomplished via an asymmetric design as shown in FIG. 3. FIG. 3 shows the circuit diagram of an asymmetric latch circuit 200 which may be used as HV latch 108 shown in FIG. 2. Latch circuit 200 may include a latch comprising cross-coupled inverters 208 and 210. The circuit may be powered by supply voltage HV, which may be provided by an external power supply. The asymmetric design may be achieved by making the PMOS device stronger than the NMOS device inside inverter 208, and making the NMOS device stronger than the PMOS device inside inverter 210. The values for capacitors 204, 206, 212, and 214 may be specified such that capacitor 204 has a value greater than the value of capacitor 206, and the value of capacitor 214 is greater than the value of capacitor 212. In addition, the channel width of NMOS device 216 may be specified to be greater than the channel width of NMOS device 202. As indicated, the gate (control) terminal of NMOS device 216 may be configured as the Set (S) input of latch circuit 200, and the gate (control) terminal of NMOS device 202 may be configured as the Reset (R) input of latch circuit 200. The asymmetric structure as shown will result in latch circuit 200 (and therefore HV latch 108, when thus implemented) asserting its output Q (having a high value) during power-up.

Referring again to FIG. 2, while Vdd is rising, Vdd-valid detector 124 may assert its output Vdd-valid when Vdd has reached a level sufficient for the logic in Vdd-valid detector 124 (CMOS logic in the embodiments shown) to operate, which may be the sum of the PMOS and NMOS threshold voltages, plus an additional ΔV (voltage difference) value. Also, at this point, as Vdd begins to rise, the POR signal at the output of inverter 106 also begins to rise, reaching its nominal high value when Vdd reaches its nominal value. Inverter 106, AND gate 116, and comparator 126, all powered by Vdd, may together form circuit 102, configured to ultimately generate the POR signal. The rising edge of the Vdd-valid signal may trigger one-shot 2 circuit to set LV latch 114, enabling Power-good (PG) detector 126. In one embodiment, PG detector 126 is implemented as a comparator with a built-in offset Vt, which may trigger when the supply voltage HV (which may be provided by the external power supply, as indicated above) exceeds the value of Vdd+Vt. When HV has reached such a value, the POR signal may be deasserted, and main logic block 104 may be released from the reset state. In one set of embodiments, PG detector 126 may be configured with hysteresis in order to prevent repetitive tripping.

At this time, an on-chip non-volatile memory 102 may safely be read, as Vdd would be higher than a required minimum voltage. Once main logic block begins operation, it may start a timer and generate a "standby pulse" ($t_{STB}$) some time following the edge of the POR signal. As shown in FIG. 2, the POR signal may be generated based on the output of PG detector 126 and the Vdd-valid signal generated by Vdd-valid detector 124. The $t_{STB}$ pulse may be used to reset both latches (HV latch 108 and LV latch 114), and thus turn off BG start-up circuit 118 (a deasserted value of the Q output of HV latch 108 will result in BG start-up circuit being disabled) and disable PG detector 126 (similarly, a deasserted value of the Q output of LV latch 114 will result in PG detector being disabled). The output of PG detector 126 may not change after it has been turned off. Therefore, from this point on, the only current associated with the power management circuits may be flowing in Vdd-valid detector 124, which may be a conventional POR circuit using a sub-μA quiescent current.

When the supply voltage HV (which may be provided by an external power supply), and hence Vdd dip below the threshold of Vdd-valid detector 124, a pulse may be generated by one-shot 1 circuit 110, setting HV latch 108 to enable BG start-up circuit 118. This may ensure that bandgap reference 120 powers up correctly when supply voltage HV recovers from a dip in its expected (or nominal) value. Not enabling BG start-up circuit 118 during the aforementioned conditions (the value of supply voltage HV dipping below its normal value), may result in loss in bandgap voltage $V_{BG}$. When the value of supply voltage HV dips to a value low enough for Vdd to exhibit a dip in its own value but without tripping Vdd-valid detector 124, main logic block 104 may still have a sufficient supply voltage to maintain the register states and a reset of main logic block 104 may not be necessary.

Memory 102 is shown for illustrative purposes, and is not required for operating POR circuit 100. The timer used for producing the standby pulse ($t_{STB}$) may be the only part configured in main logic block 104 to assist in the operation of POR circuit 100.

Figure 4:
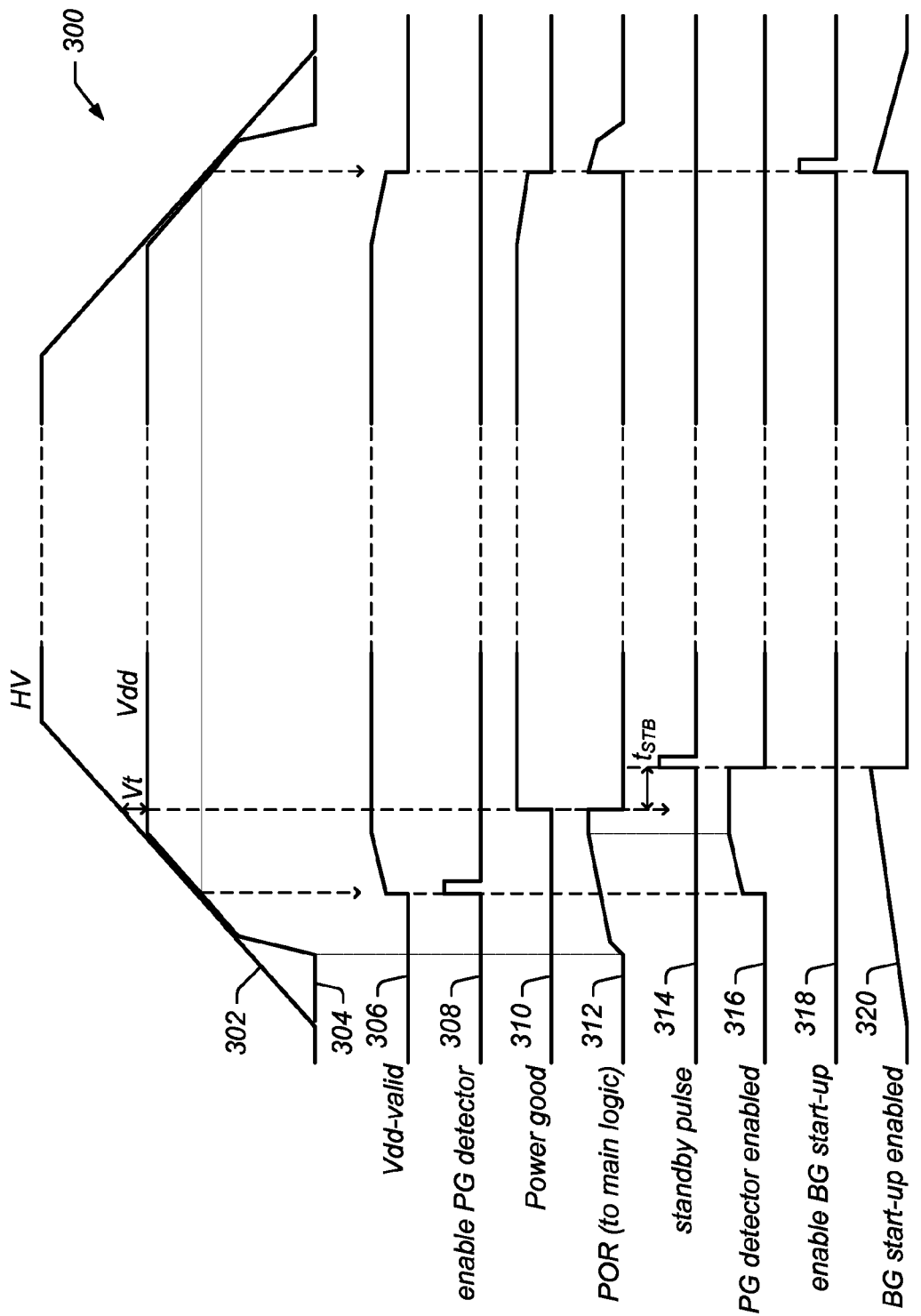
FIG. 4 is timing diagram showing the behavior of various signals for the power supply powering up and down, according to principles of the present invention.

The timing diagram in FIG. 4 shows the behavior of various signals from the POR circuit of FIG. 2, for a voltage supply (which may be an external voltage supply providing supply voltage HV) powering up and down. Waveform 302 represents the (external) supply voltage HV, and waveform 304 represents the (internal) supply voltage Vdd generated based on supply voltage HV, and provided to the IC (which may contain, for example, main logic 104 from FIG. 2). Because the output Q of HV latch 108 is asserted by default when HV (302) is powering up, BG start-up 118 is enabled as shown in waveform 320, causing reference voltage $V_{BG}$ to rise, causing Vdd to rise (waveform 304). Since both inputs to AND gate 116 are low during power up of HV (302), once Vdd begins to rise, hence powering AND gate 116, the POR signal to main logic block 104 (taken as the output of inverter 106) also begins to rise, and eventually reaches its asserted (high) value as shown in waveform 312.

When Vdd reaches a level sufficient for the logic to operate, the Vdd-valid signal is asserted as shown in waveform 306, triggering one-shot circuit 110, which generates a PG detector enable pulse as shown in waveform 308. This results in the output Q of LV latch 114 being asserted, enabling PG detector 126 as shown in waveform 316. Once Vdd has stabilized (or is considered to have stabilized), that is, the value of HV reaches a value that equals Vdd+Vt, then PG detector 126 is triggered, enabling its output (Power good signal) as shown in waveform 310, in this case going from a low voltage to a high voltage. Once the Power good signal is asserted, both the Vdd-valid signal and Power-good signal will be asserted at the same time, resulting in the output of AND gate 116 to be asserted, thereby bringing down the value of the POR signal (output of inverter 106) as shown in waveform 312.

A specified amount of time ($t_{STB}$) following the falling edge of the POR signal (as shown in waveform 312), a standby pulse is generated, (provided, for example, by main logic block 104) as shown in waveform 314, which resets both latches (HV latch 108 and LV latch 114), resulting in PG detector 126 being disabled as shown in waveform 316, and also BG start-up circuit 118 being disabled as shown in waveform 320. By disabling BG start-up circuit 118, the BG reference voltage may be restarted later if necessary (as is the case when HV and/or Vdd dip below acceptable levels, then begin to rise again). As also shown in waveform 310, the value of the Power good signal remains unchanged after PG detector 126 has been turned off, thereby also keeping the value of the POR signal unchanged as shown in waveform 312.

When the value of HV (i.e. the primary supply voltage), and hence also the value of Vdd (i.e. the secondary, or derived supply voltage), as shown in waveforms 302 and 304, fall below the value of the threshold of Vdd-valid detector circuit 124, Vdd-valid signal is deasserted as shown in waveform 306. As a result, the Power good signal is also deasserted as shown in waveform 310, resulting in the assertion of the POR signal as shown in waveform 312, resetting main logic block 104. In addition, one shot circuit 110 generates a pulse on the falling edge of the Vdd-valid signal (one shot circuit 110 may be configured to trigger on a falling edge) shown as the pulse in waveform 318, setting HV latch 108, which will enable BG start-up circuit 118 as shown in waveform 320. Again, this may guarantee proper powering up of bandgap reference 120 when HV begins to rise again, preventing loss of bandgap voltage.

Figure 5:
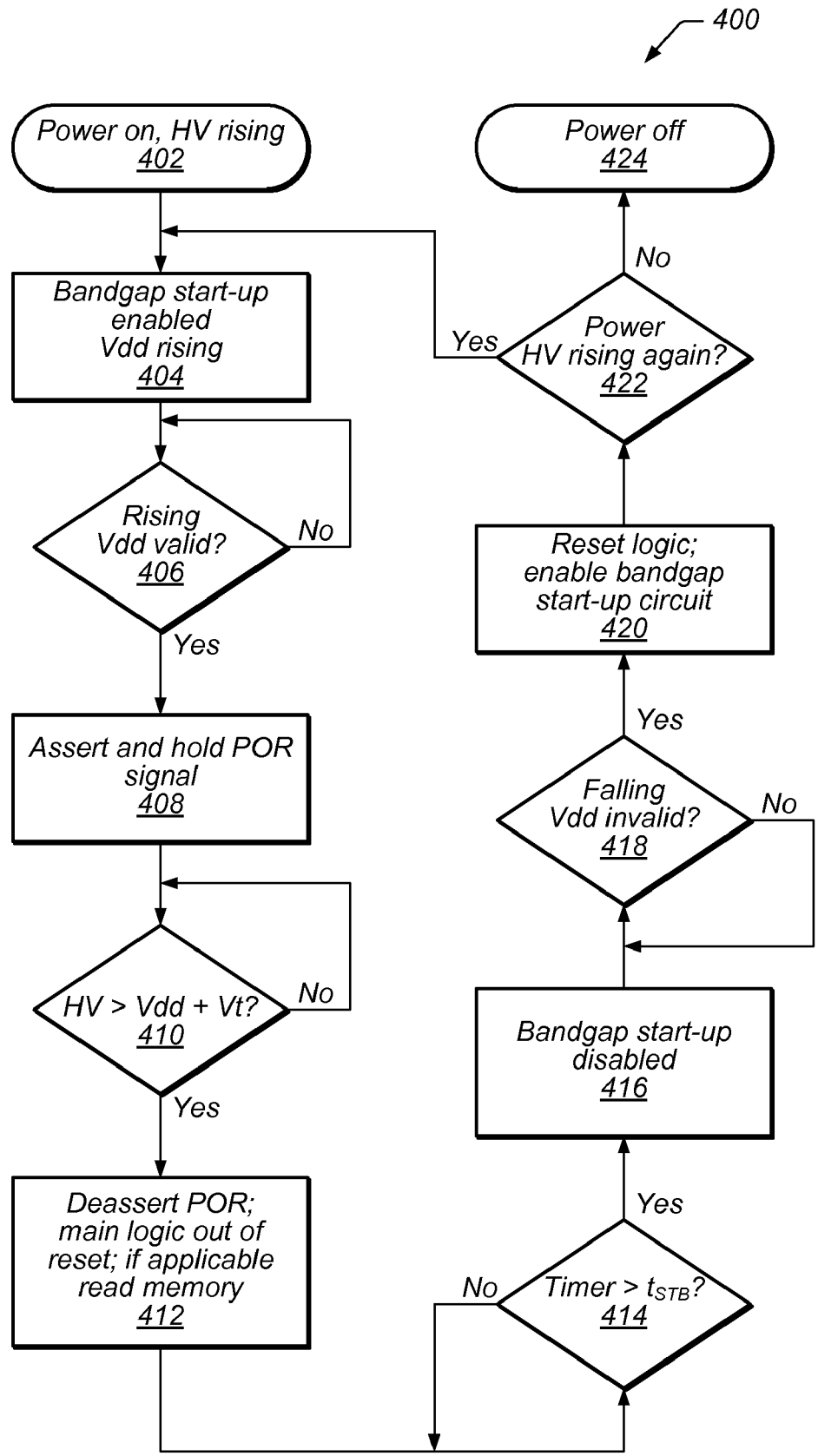
FIG. 5 is a flow diagram of a method for generating a POR signal, according to principles of the present invention.

FIG. 5 shows a flow diagram of a method for generating a POR signal, using a circuit such as POR circuit 100, for example. When power is turned on, i.e. a primary power supply—which may be an external power supply—is powered on, the primary supply voltage HV may begin to rise (402). In response to 402, a bandgap reference voltage generator start-up may be enabled, resulting in a secondary supply voltage Vdd—generated based on the primary supply voltage and the bandgap reference voltage—may also begin to rise (404). When the Vdd supply voltage is valid (406—e.g. when Vdd has reached a level sufficient for the logic elements which are powered by Vdd to begin operating), a reset (POR) signal may be asserted (408). Once the primary supply voltage reaches a value that is greater than a sum of the value of the secondary supply voltage and a specified threshold voltage (410), the POR signal may be deasserted to bring the main logic out of reset, and (if applicable) system memory may be read (412).

A specified period of time from when the POR signal is deasserted (414), the bandgap reference voltage generator start-up circuit may be disabled (416). If the Vdd supply voltage begins falling and reaches a value no longer considered valid (418—e.g. when Vdd has reached a level insufficient for the logic elements which are powered by Vdd to continue operating), the POR signal may be asserted for a brief time to reset the main logic, and the bandgap reference voltage generator start-up circuit may again be enabled (420). If the primary supply voltage HV begins rising again (422—Yes), the power-up procedure is repeated from 404. If the primary supply voltage HV does not rise (422—No), the system may be completely powered off.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. A power-on-reset (POR) circuit comprising:
    a first circuit powered by a first supply voltage and configured to generate a second supply voltage based on the first supply voltage, the second supply voltage having a nominal value lower than a nominal value of the first supply voltage;
    a second circuit powered by the second supply voltage and configured to generate a POR signal, wherein the second circuit is configured to:
        assert the POR signal when the second supply voltage reaches a first value that is sufficiently high for the second circuit to become operational;
        keep the POR signal asserted until the first supply voltage reaches a second value that is higher than the nominal value of the second supply voltage by a specified difference voltage value; and
        deassert the POR signal once the first supply voltage reaches the second value; and
    a third circuit powered by the first supply voltage and configured to generate a reference voltage, wherein the first circuit is configured to generate the second supply voltage based on the first supply voltage and the reference voltage, wherein an actual value of the reference voltage determines an actual value of the second supply voltage.

2. The POR circuit of claim 1, wherein the reference voltage is a bandgap reference voltage.

3. The POR circuit of claim 1, further comprising a start-up circuit powered by the first supply voltage and configured to provide a start signal to the third circuit, wherein the third circuit is configured to begin generating the reference voltage when the start signal changes from a non-asserted state to being asserted.

4. The POR circuit of claim 3, further comprising a latch powered by the first supply voltage and configured to enable and disable the start-up circuit, wherein the start-up circuit is configured to assert the start signal when the start-up circuit is enabled.

5. The POR circuit of claim 4, wherein the latch is an asymmetric latch configured to assert its output when the latch is powered up.

6. The POR circuit of claim 1 further configured to receive a control signal from an external circuit that is powered by the second supply voltage and is configured to be reset by the POR signal;
    wherein the POR circuit is further configured to disable specified modules comprised within the POR circuit in response to the control signal being asserted by the external circuit.

7. The POR circuit of claim 1, further comprising a third circuit powered by the second supply voltage and configured to generate a control signal, wherein the third circuit is configured to assert the control signal when the second supply voltage reaches a specific value that is sufficiently high for the third circuit to become operational, and deassert the control signal when the second supply voltage drops below the specific value;
    wherein the second circuit is configured to:
        receive the control signal;
        assert the POR signal when the control signal is asserted as the second supply voltage is rising; and
        assert the POR signal when the control signal is deasserted as the second supply voltage is falling.

8. The POR circuit of claim 7, wherein the second circuit comprises a comparator configured to compare the first supply voltage and the second supply voltage, and assert an output signal when the comparator is enabled and the first supply voltage reaches the specific value;
    wherein the second circuit is configured to generate the POR signal from the control signal and the output signal.

9. A method of generating a power-on-reset (POR) signal, the method comprising:
    generating a second supply voltage based on a first supply voltage, the second supply voltage having a nominal value lower than a nominal value of the first supply voltage;
    asserting the POR signal in response to the second supply voltage reaching a first value that is sufficiently high for devices powered by the second supply voltage to become operational;
    keeping the POR signal asserted until the first supply voltage reaches a second value that is higher than the nominal value of the second supply voltage by a specified difference voltage value; and
    deasserting the POR signal in response to the first supply voltage reaching the second value; and
    applying the POR signal to a selected system to reset the selected system.

10. The method of claim 9, further comprising generating a reference voltage;
    wherein said generating the second supply voltage comprises generating the second supply voltage based on the first supply voltage and the reference voltage, wherein an actual value of the reference voltage determines an actual value of the second supply voltage.

11. The method of claim 10, further comprising asserting a start signal;
    wherein said generating the reference voltage is performed in response to said asserting the start signal.

12. The method of claim 11, further comprising performing one or more of:
    deasserting the start signal at a specified time following said deasserting the POR signal; or disabling specified modules powered by the first supply voltage and/or specified modules powered by the second supply voltage at the specified time following said deasserting the POR signal.

13. The method of claim 12, further comprising generating a standby pulse;
wherein said deasserting the start signal and/or said disabling the specified modules are performed in response to said generating the standby pulse.

14. The method of claim 9, wherein said asserting the POR signal comprises asserting the POR signal in response to the second supply voltage reaching the first value as the second supply voltage is rising.

15. The method of claim 9, further comprising asserting the POR signal in response to the second supply voltage falling below the first value as the second supply voltage is falling.

16. A system comprising:
a main circuit configured to be powered by a first supply voltage; and
a power-on-reset (POR) circuit configured to provide a POR signal to the main circuit, the POR circuit comprising:
a first circuit powered by a second supply voltage and configured to generate the first supply voltage based on the second supply voltage, the first supply voltage having a nominal value lower than a nominal value of the second supply voltage;
a second circuit powered by the first supply voltage and configured to generate a POR signal, wherein the second circuit is configured to:
assert the POR signal when the first supply voltage reaches a first value that is sufficiently high for circuits powered by the first supply voltage to become operational;
keep the POR signal asserted until the second supply voltage reaches a second value that is higher than the nominal value of the first supply voltage by a specified difference voltage value; and
deassert the POR signal once the second supply voltage reaches the second value;
wherein the main circuit is reset when the POR signal is asserted;
wherein the main circuit is configured to read the memory once the second circuit deasserts the POR signal.

17. The system of claim 16, wherein the main circuit is configured to generate a standby pulse at a specified time following the second circuit's deasserting of the POR signal, and to provide the standby pulse to the POR circuit;
wherein the POR circuit is further configured to disable specified modules comprised within the POR circuit in response to receiving the standby pulse.

18. A power-on-reset (POR) circuit comprising:
a first circuit powered by a first supply voltage and configured to generate a second supply voltage based on the first supply voltage, the second supply voltage having a nominal value lower than a nominal value of the first supply voltage; and
a second circuit powered by the second supply voltage and configured to generate a POR signal, wherein the second circuit is configured to:
assert the POR signal when the second supply voltage reaches a first value that is sufficiently high for the second circuit to become operational;
keep the POR signal asserted until the first supply voltage reaches a second value that is higher than the nominal value of the second supply voltage by a specified difference voltage value; and
deassert the POR signal once the first supply voltage reaches the second value;
wherein the POR circuit is configured to receive a control signal from an external circuit that is powered by the second supply voltage and is configured to be reset by the POR signal; and
wherein the POR circuit is further configured to disable specified modules comprised within the POR circuit in response to the control signal being asserted by the external circuit.

19. The POR circuit of claim 18, further comprising a third circuit powered by the first supply voltage and configured to generate a reference voltage, wherein the first circuit is configured to generate the second supply voltage based on the first supply voltage and the reference voltage, wherein an actual value of the reference voltage determines an actual value of the second supply voltage;
wherein the reference voltage is a bandgap reference voltage.

20. The POR circuit of claim 18, further comprising:
a third circuit powered by the first supply voltage and configured to generate a reference voltage, wherein the first circuit is configured to generate the second supply voltage based on the first supply voltage and the reference voltage, wherein an actual value of the reference voltage determines an actual value of the second supply voltage; and
a start-up circuit powered by the first supply voltage and configured to provide a start signal to the third circuit, wherein the third circuit is configured to begin generating the reference voltage when the start signal changes from a non-asserted state to being asserted.

21. The POR circuit of claim 20, further comprising a latch powered by the first supply voltage and configured to enable and disable the start-up circuit, wherein the start-up circuit is configured to assert the start signal when the start-up circuit is enabled.

22. The POR circuit of claim 21, wherein the latch is an asymmetric latch configured to assert its output when the latch is powered up.

23. The POR circuit of claim 18, further comprising a third circuit powered by the second supply voltage and configured to generate a control signal, wherein the third circuit is configured to assert the control signal when the second supply voltage reaches a specific value that is sufficiently high for the third circuit to become operational, and deassert the control signal when the second supply voltage drops below the specific value;
wherein the second circuit is configured to:
receive the control signal;
assert the POR signal when the control signal is asserted as the second supply voltage is rising; and
assert the POR signal when the control signal is deasserted as the second supply voltage is falling.

24. The POR circuit of claim 23, wherein the second circuit comprises a comparator configured to compare the first supply voltage and the second supply voltage, and assert an output signal when the comparator is enabled and the first supply voltage reaches the specific value;
wherein the second circuit is configured to generate the POR signal from the control signal and the output signal.

25. A power-on-reset (POR) circuit comprising:
a first circuit powered by a first supply voltage and configured to generate a second supply voltage based on the first supply voltage, the second supply voltage having a nominal value lower than a nominal value of the first supply voltage;

a second circuit powered by the second supply voltage and configured to generate a POR signal, wherein the second circuit is configured to:
  assert the POR signal when the second supply voltage reaches a first value that is sufficiently high for the second circuit to become operational;
  keep the POR signal asserted until the first supply voltage reaches a second value that is higher than the nominal value of the second supply voltage by a specified difference voltage value; and
  deassert the POR signal once the first supply voltage reaches the second value; and
a third circuit powered by the second supply voltage and configured to generate a control signal, wherein the third circuit is configured to assert the control signal when the second supply voltage reaches a specific value that is sufficiently high for the third circuit to become operational, and deassert the control signal when the second supply voltage drops below the specific value;
wherein the second circuit is further configured to:
  receive the control signal;
  assert the POR signal when the control signal is asserted as the second supply voltage is rising; and
  assert the POR signal when the control signal is deasserted as the second supply voltage is falling.

26. The POR circuit of claim 25, further comprising a third circuit powered by the first supply voltage and configured to generate a reference voltage, wherein the first circuit is configured to generate the second supply voltage based on the first supply voltage and the reference voltage, wherein an actual value of the reference voltage determines an actual value of the second supply voltage;
  wherein the reference voltage is a bandgap reference voltage.

27. The POR circuit of claim 26, further comprising:
  a third circuit powered by the first supply voltage and configured to generate a reference voltage, wherein the first circuit is configured to generate the second supply voltage based on the first supply voltage and the reference voltage, wherein an actual value of the reference voltage determines an actual value of the second supply voltage; and
  a start-up circuit powered by the first supply voltage and configured to provide a start signal to the third circuit, wherein the third circuit is configured to begin generating the reference voltage when the start signal changes from a non-asserted state to being asserted.

28. The POR circuit of claim 27, further comprising a latch powered by the first supply voltage and configured to enable and disable the start-up circuit, wherein the start-up circuit is configured to assert the start signal when the start-up circuit is enabled.

29. The POR circuit of claim 28, wherein the latch is an asymmetric latch configured to assert its output when the latch is powered up.

30. The POR circuit of claim 25, wherein the second circuit comprises a comparator configured to compare the first supply voltage and the second supply voltage, and assert an output signal when the comparator is enabled and the first supply voltage reaches the specific value;
  wherein the second circuit is configured to generate the POR signal from the control signal and the output signal.

31. A method of generating a power-on-reset (POR) signal, the method comprising:
  generating a reference voltage;
  generating a second supply voltage based on a first supply voltage and the reference voltage, wherein an actual value of the reference voltage determines an actual value of the second supply voltage, and wherein a nominal value of the second supply voltage is lower than a nominal value of the first supply voltage;
  asserting the POR signal in response to the second supply voltage reaching a first value that is sufficiently high for devices powered by the second supply voltage to become operational;
  keeping the POR signal asserted until the first supply voltage reaches a second value that is higher than the nominal value of the second supply voltage by a specified difference voltage value;
  deasserting the POR signal in response to the first supply voltage reaching the second value.

32. The method of claim 31, further comprising asserting a start signal;
  wherein said generating the reference voltage is performed in response to said asserting the start signal.

33. The method of claim 32, further comprising performing one or more of:
  deasserting the start signal at a specified time following said deasserting the POR signal; or
  disabling specified modules powered by the first supply voltage and/or specified modules powered by the second supply voltage at the specified time following said deasserting the POR signal.

34. The method of claim 33, further comprising generating a standby pulse;
  wherein said deasserting the start signal and/or said disabling the specified modules are performed in response to said generating the standby pulse.

35. A method of generating a power-on-reset (POR) signal, the method comprising:
  generating a second supply voltage based on a first supply voltage, the second supply voltage having a nominal value lower than a nominal value of the first supply voltage;
  asserting the POR signal in response to the second supply voltage reaching a first value that is sufficiently high for devices powered by the second supply voltage to become operational, the second supply voltage reaching the first value as the second supply voltage is rising;
  keeping the POR signal asserted until the first supply voltage reaches a second value that is higher than the nominal value of the second supply voltage by a specified difference voltage value; and
  deasserting the POR signal in response to the first supply voltage reaching the second value.

36. The method of claim 35, further comprising generating a reference voltage;
  wherein said generating the second supply voltage comprises generating the second supply voltage based on the first supply voltage and the reference voltage, wherein an actual value of the reference voltage determines an actual value of the second supply voltage.

37. The method of claim 36, further comprising asserting a start signal;
  wherein said generating the reference voltage is performed in response to said asserting the start signal.

38. The method of claim 37, further comprising performing one or more of:
  deasserting the start signal at a specified time following said deasserting the POR signal; or
  disabling specified modules powered by the first supply voltage and/or specified modules powered by the second supply voltage at the specified time following said deasserting the POR signal.

39. The method of claim 38, further comprising generating a standby pulse;
  wherein said deasserting the start signal and/or said disabling the specified modules are performed in response to said generating the standby pulse.

40. A method of generating a power-on-reset (POR) signal, the method comprising:
  generating a second supply voltage based on a first supply voltage, the second supply voltage having a nominal value lower than a nominal value of the first supply voltage;
  asserting the POR signal in response to the second supply voltage reaching a first value that is sufficiently high for devices powered by the second supply voltage to become operational;
  keeping the POR signal asserted until the first supply voltage reaches a second value that is higher than the nominal value of the second supply voltage by a specified difference voltage value;
  deasserting the POR signal in response to the first supply voltage reaching the second value; and
  asserting the POR signal in response to the second supply voltage falling below the first value as the second supply voltage is falling.

41. The method of claim 40, further comprising generating a reference voltage;
  wherein said generating the second supply voltage comprises generating the second supply voltage based on the first supply voltage and the reference voltage, wherein an actual value of the reference voltage determines an actual value of the second supply voltage.

42. The method of claim 41, further comprising asserting a start signal;
  wherein said generating the reference voltage is performed in response to said asserting the start signal.

43. The method of claim 42, further comprising performing one or more of:
  deasserting the start signal at a specified time following said deasserting the POR signal; or
  disabling specified modules powered by the first supply voltage and/or specified modules powered by the second supply voltage at the specified time following said deasserting the POR signal.

44. The method of claim 43, further comprising generating a standby pulse;
  wherein said deasserting the start signal and/or said disabling the specified modules are performed in response to said generating the standby pulse.

45. The method of claim 40, wherein said asserting the POR signal comprises asserting the POR signal in response to the second supply voltage reaching the first value as the second supply voltage is rising.

46. A system comprising:
  a main circuit configured to be powered by a first supply voltage; and
  a power-on-reset (POR) circuit configured to provide a POR signal to the main circuit, the POR circuit comprising:
    a first circuit powered by a second supply voltage and configured to generate the first supply voltage based on the second supply voltage, the first supply voltage having a nominal value lower than a nominal value of the second supply voltage; and
    a second circuit powered by the first supply voltage and configured to generate a POR signal, wherein the second circuit is configured to:
      assert the POR signal when the first supply voltage reaches a first value that is sufficiently high for circuits powered by the first supply voltage to become operational;
      keep the POR signal asserted until the second supply voltage reaches a second value that is higher than the nominal value of the first supply voltage by a specified difference voltage value; and
      deassert the POR signal once the second supply voltage reaches the second value;
  wherein the main circuit is reset when the POR signal is asserted;
  wherein the main circuit is configured to generate a standby pulse at a specified time following the second circuit's deasserting of the POR signal, and to provide the standby pulse to the POR circuit; and
  wherein the POR circuit is further configured to disable specified modules comprised within the POR circuit in response to receiving the standby pulse.

* * * * *